(12) United States Patent
Sawataishi et al.

(10) Patent No.: US 8,618,819 B2
(45) Date of Patent: Dec. 31, 2013

(54) CAPACITANCE DETECTOR

(75) Inventors: Tomoyuki Sawataishi, Miyagi-Ken (JP); Junichiro Oya, Miyagi-Ken (JP)

(73) Assignee: Alps Electric Co., Ltd., Tokyo (JP)

( * ) Notice: Subject to any disclaimer, the term of this patent is extended or adjusted under 35 U.S.C. 154(b) by 397 days.

(21) Appl. No.: 13/034,344

(22) Filed: Feb. 24, 2011

(65) Prior Publication Data

US 2011/0221399 A1    Sep. 15, 2011

(30) Foreign Application Priority Data

Mar. 15, 2010   (JP) .................................. 2010-057587

(51) Int. Cl.
   *G01R 27/26*   (2006.01)
(52) U.S. Cl.
   USPC ............ 324/679; 324/658; 324/684; 320/166
(58) Field of Classification Search
   USPC .............................................. 324/658–690
   See application file for complete search history.

(56) References Cited

U.S. PATENT DOCUMENTS

| | | | |
|---|---|---|---|
| 6,949,937 B2* | 9/2005 | Knoedgen | 324/658 |
| 2009/0051656 A1* | 2/2009 | Saito | 345/168 |
| 2010/0013502 A1* | 1/2010 | Kuang | 324/686 |

* cited by examiner

*Primary Examiner* — Jermele M Hollington
*Assistant Examiner* — Adam Clarke
(74) *Attorney, Agent, or Firm* — Brinks Gilson & Lione

(57) ABSTRACT

A capacitance detector includes: a first capacitor with fixed base capacitance and variable capacitance; a second capacitor charged with base charge corresponding to the base capacitance; third and fourth capacitors which receive capacitance distribution from the first or second capacitor; a first switching means for charging the first and second capacitors to a first fixed voltage and charging the third and fourth capacitors to a second fixed voltage in a first section and for charging the first and second capacitors to the second fixed voltage and charging the third and fourth capacitors to the first fixed voltage in a second section; a second switching means for separating the first and second capacitors from the third and fourth capacitors and for connecting the first and second capacitors to the third and fourth capacitors; and a differential amplifier to which first and second voltages corresponding to equalized charge are differentially input.

5 Claims, 4 Drawing Sheets

CAPACITANCE DETECTOR

CLAIM OF PRIORITY

This application claims benefit of Japanese Patent Application No. 2010-057587 filed on Mar. 15, 2010, which is hereby incorporated by reference.

BACKGROUND OF THE INVENTION

1. Field of the Invention

The present invention relates to a capacitance detector which detects a small change in capacitance.

2. Description of the Related Art

A capacitance detector which uses a differential detection voltage in order to improve an anti-noise property is known (for example, refer to Japanese Unexamined Patent Application Publication No. 2006-253764). FIG. 7 is a view showing the configuration of a capacitance detection circuit disclosed in Japanese Unexamined Patent Application Publication No. 2006-253764, and FIG. 8 is a timing chart of the capacitance detection circuit.

In the first stage of the capacitance detection circuit shown in FIG. 7, a first capacitor C11 is charged to a voltage Vdd and a second capacitor C12 is grounded by turning on only a switch SW1. Then, by turning off the switch SW1 and turning on a switch SW2, a voltage Vo(+) when the amount of electric charge of the first capacitor C11 is equalized in capacitors C11, C12, and C13 is obtained. A (+) voltage of a differential output is obtained by sampling and holding of the voltage Vo(+) in the capacitor C13.

Then, in the second stage, the first capacitor C11 is grounded and the second capacitor C12 is charged to the voltage Vdd by turning off the switch SW2 and turning on a switch SW3. Then, by turning on a switch SW4, a voltage Vo(−) when the amount of electric charge of the second capacitor C12 is equalized in capacitors C11, C12, and C14 is obtained. A (−) voltage of the differential output is obtained by sampling and holding of the voltage Vo(−) in the capacitor C14.

Finally, a switch SW5 is turned on to transmit (+) and (−) sides of the differential output simultaneously to a differential amplifier AMP. As a result, differential detection voltages are obtained.

SUMMARY OF THE INVENTION

However, in the capacitance detector in the related art two stages, first and second stages, are necessary in order to generate an output. For this reason, if the number of times of signal acquisition within a certain time is reduced, the detection sensitivity is reduced. As a result, there is a problem in that the speed of signal acquisition is not increased. Moreover, since the equalization is performed using three capacitors of first and second capacitors and a sampling and holding capacitor in the capacitance detector in the related art, there is a problem in that the amount of voltage fluctuation after equalization is reduced.

In view of the above situation, it is preferable to provide a capacitance detector capable of improving the detection sensitivity by increasing the number of times of signal acquisition within a predetermined time and of improving the detection accuracy by preventing a reduction in the amount of voltage fluctuation caused by equalization.

According to an embodiment of the present invention, there is provided a capacitance detector including: a first capacitor which is an object to be detected and has fixed base capacitance and variable capacitance; a second capacitor charged with base charge corresponding to the base capacitance; third and fourth capacitors which receive capacitance distribution from the first or second capacitor; a first switching means for charging the first and second capacitors to a first fixed voltage and charging the third and fourth capacitors to a second fixed voltage in a first section and for charging the first and second capacitors to the second fixed voltage and charging the third and fourth capacitors to the first fixed voltage in a second section; a second switching means for separating the first and second capacitors from the third and fourth capacitors during a charge period in the first and second sections and for connecting the first and second capacitors to the third and fourth capacitors in a one-to-one manner at a capacitance distribution timing in the first and second sections; and a differential amplifier to which first and second voltages corresponding to equalized charge, which is equalized by capacitors connected to each other by the second switching means and which is held in the third and fourth capacitors, are differentially input.

According to this configuration, since a detection voltage difference can be output in each of the first and second sections even though two stages of the first and second sections are necessary, it is possible to prevent a reduction in the detection sensitivity caused by an increase in the number of times of signal acquisition.

Moreover, in the capacitance detector according to the embodiment of the invention, the second switching means may perform alternate switching between a straight connection for connecting the first and third capacitors to each other and connecting the second and fourth capacitors to each other and a cross connection for connecting the first and fourth capacitors to each other and connecting the second and third capacitors to each other.

Through this configuration, held charge distributed from the first capacitor to the third capacitor in the first section and held charge distributed from the first capacitor to the fourth capacitor in the second stage have opposite polarities. Accordingly, even if noise is mixed into the first capacitor, it is possible to remove the noise component by subsequent processing (differential and integration processing). As a result, an anti-noise property can be improved.

The capacitance detector described above may further include a third switching means for inverting an input signal polarity for a subsequent process at an output end of the differential amplifier. The second switching means may perform straight connection between the first and second capacitors and the third and fourth capacitors, and the third switching means may alternately invert the input signal polarity.

In this case, even if a circuit configuration for cross connection is removed from a circuit section which performs equalization of electric charge, a noise component with an opposite polarity can be acquired by just switching the input signal polarity using the third switching means.

The capacitance detector described above may further include a third switching means for inverting a polarity of a signal input to the differential amplifier between the third and fourth capacitors and an input end of the differential amplifier. The second switching means may perform straight connection between the first and second capacitors and the third and fourth capacitors, and the third switching means may alternately invert the input signal polarity.

In this case, even if a circuit configuration for cross connection is removed from a circuit section which performs equalization of electric charge, a noise component with an opposite polarity can be acquired by just switching the input signal polarity using the third switching means.

The capacitance detector described above may further include a current source which is connected to one end of each of the first and second capacitors and which extracts a predetermined amount of electric charge from the first or second capacitor after the charge period in the first and second sections.

Through this configuration, since a large capacitance difference can be ensured by extraction of electric charge using the current source, the sensitivity can be improved.

According to the embodiment of the invention, it is preferable to realize a capacitance detector capable of improving the detection sensitivity by increasing the number of times of signal acquisition within a predetermined time and of improving the detection accuracy by suppressing a reduction in the amount of voltage fluctuation caused by equalization.

DESCRIPTION OF THE PREFERRED EMBODIMENTS

Hereinafter, embodiments of the invention will be described in detail with reference to the accompanying drawings.

Figure 1:
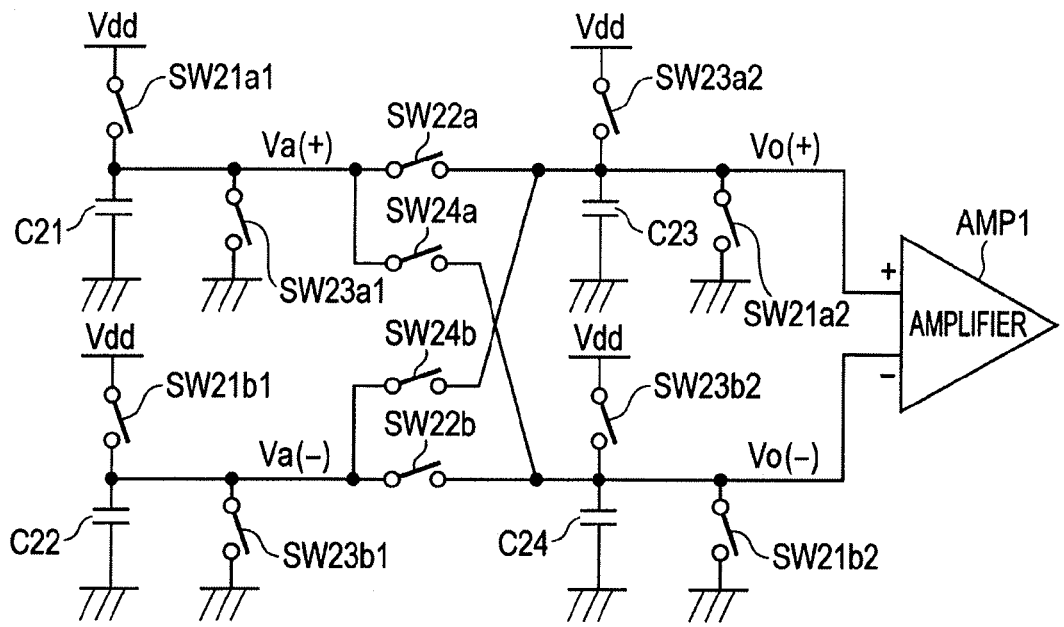
FIG. 1 is a view showing the circuit configuration of a capacitance detector according to a first embodiment of the invention.

FIG. 1 is a view showing the circuit configuration of a capacitance detector according to a first embodiment of the invention.

The capacitance detector according to the present embodiment includes, as main constituent components, four capacitors involving one capacitor to be detected C21 and three reference capacitors C22, C23, and C24, first switches SW21$a$1, SW21$a$2, SW21$b$1, SW21$b$2, SW23$a$1, SW23$a$2, SW23$b$1, and SW23$b$2 which charge/discharge the capacitors, second switches SW22$a$, SW22$b$, SW24$a$, and SW24$b$ which connect predetermined capacitors to each other for equalization of held charge, and a differential amplifier AMP1 which outputs a difference between two equalized charges (detection voltages).

A change in electrostatic capacitance of the capacitor to be detected C21, which is a first capacitor, is to be detected. One end of the capacitor to be detected C21 is connected to the ground, and the other end of the capacitor to be detected C21 is connected to a first fixed voltage (voltage Vdd) through the switch SW21$a$1 and also connected to a second fixed voltage (ground) through the switch SW23$a$1. In addition, a power supply side terminal of the capacitor to be detected C21 is connected to a power supply side terminal of the reference capacitor C23 as a third capacitor through the switch SW22$a$ (straight connection) and also connected to a power supply side terminal of the reference capacitor C24 as a fourth capacitor through the switch SW24$a$ (cross connection).

The reference capacitor C22 as a second capacitor is charged with the same base charge (Vdd, ground) at the same timing as the capacitor to be detected C21. One end of the reference capacitor C22 is connected to the second fixed voltage (ground), and the other end of the reference capacitor C22 is connected to the first fixed voltage (voltage Vdd) through the switch SW21$b$1 and also connected to the second fixed voltage (ground) through the switch SW23$b$1. In addition, a power supply side terminal (other end) of the reference capacitor C22 is connected to a power supply side terminal of the reference capacitor C24 through the switch SW22$b$ (straight connection) and also connected to a power supply side terminal of the reference capacitor C23 through the switch SW24$b$ (cross connection).

Equalization (capacitance distribution) of held charge between the reference capacitors C23 and C24 and the capacitor to be detected C21 or the reference capacitor C22 is performed. One end of the reference capacitor C23 is connected to the second fixed voltage (ground), and the other end of the reference capacitor C23 located at the power supply terminal side is connected to the first fixed voltage (voltage Vdd) through the switch SW23$a$2 and also connected to the second fixed voltage (ground) through the switch SW21$a$2. The power supply side terminal of the reference capacitor C23 is connected to a "+" input terminal of the differential amplifier AMP1 and holds a "+" input Vo(+). In addition, one end of the reference capacitor C24 is connected to the second fixed voltage (ground), and the other end of the reference capacitor C24 located at the power supply terminal side is connected to the first fixed voltage (voltage Vdd) through the switch SW23$b$2 and also connected to the second fixed voltage (ground) through the switch SW21$b$. The power supply side terminal of the reference capacitor C24 is connected to a "−" input terminal of the differential amplifier AMP1 and holds an "−" input Vo(−).

Figure 2:
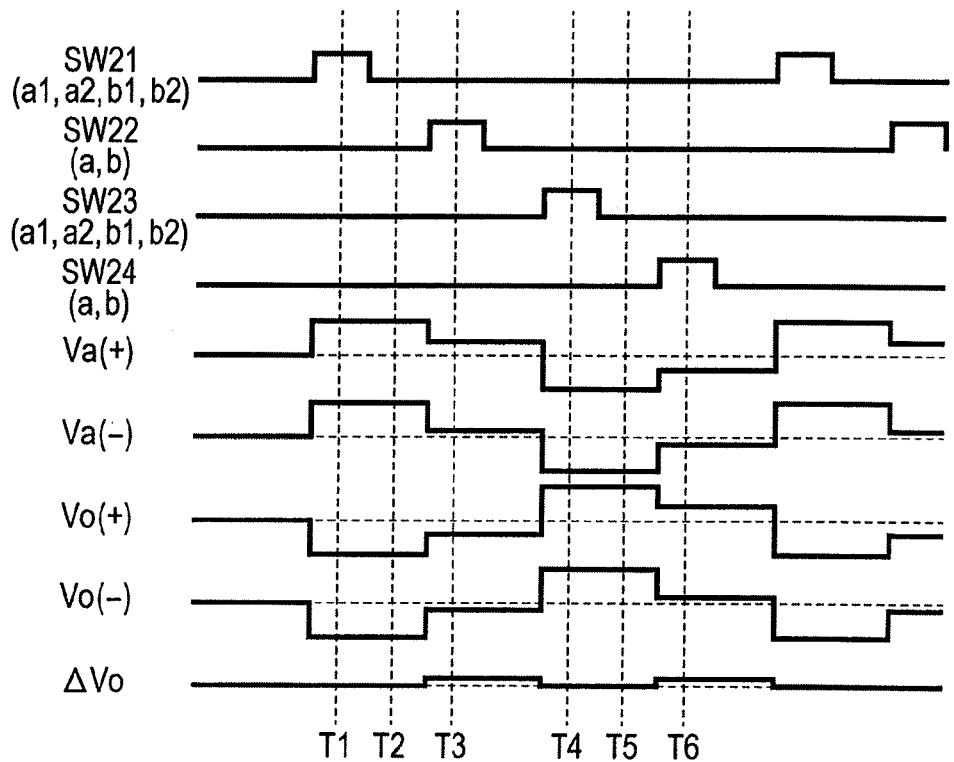
FIG. 2 shows a timing chart of opening and closing timing of each switch and an output waveform of each section in the first embodiment.

FIG. 2 shows a timing chart of opening and closing timing of each switch and an output waveform of each section in the capacitance detector according to the present embodiment. An operation of the capacitance detector according to the present embodiment will be described with reference to FIG. 2.

At a timing T1, the switches SW21$a$1, SW21$a$2, SW21$b$1, and SW21$b$2 which connect the capacitor to be detected C21 and the reference capacitor C22 to the first fixed voltage are turned on. Other switches are turned off. As a result, the capacitor to be detected C21 and the reference capacitor C22 are charged to the first fixed voltage (Vdd), and the reference capacitors C23 and C24 are charged to the second fixed voltage (ground).

At a timing T2, the switches SW21$a$1 and SW21$b$1 are turned off, but the electric charge charged at the timing T1 is held in the capacitor to be detected C21 and the reference capacitor C22.

At a timing T3, the switches SW22$a$ and SW22$b$ are turned on. The power supply side terminal of the capacitor to be detected C21 and the power supply side terminal of the reference capacitor C23 are connected to each other through the switch SW22$a$. As a result, held charge of the capacitor to be detected C21 and the reference capacitor C23 is equalized to become a voltage Vo(+). Similarly, the power supply side terminal of the reference capacitor C22 and the power supply side terminal of the reference capacitor C24 are connected to each other through the switch SW22b. As a result, held charge of the reference capacitors C22 and C24 is equalized to become a voltage Vo(−). At this point in time, the voltages Vo(+) and Vo(−) are input to the differential amplifier AMP1, and a difference between the detection voltages is output.

In this case, a detection voltage difference ΔVo is expressed by the expression given below assuming that the capacitor to be detected C21 is Cs, the reference capacitor C22 is Cb, and the reference capacitors C23 and C24 are Cm.

$$\Delta Vo = \frac{Cs - Cb}{Cs + Cb + Cm + \frac{Cs \cdot Cb}{Cm}} \cdot Vdd \qquad \text{[Expression 1]}$$

A stage from the timing T1 to the timing T3 (before the switch SW23 operates) is a first section.

At a timing T4, the switches SW23a1, SW23a2, SW23b1, and SW23b2 are turned on. The power supply side terminal of the capacitor to be detected C21 is connected to the second fixed voltage (ground) through the switch SW23a1, and the power supply side terminal of the reference capacitor C22 is connected to the second fixed voltage (ground) through the switch SW23b1. As a result, the capacitor to be detected C21 and the reference capacitor C22 are charged to the second fixed voltage (ground). In addition, the power supply side terminal of the reference capacitor C23 is connected to the first fixed voltage (voltage Vdd) through the switch SW23a2, and the power supply side terminal of the reference capacitor C24 is connected to the first fixed voltage (voltage Vdd) through the switch SW23b2. As a result, the reference capacitors C23 and C24 are charged to the first fixed voltage (voltage Vdd).

At a timing T5, the switches SW23a1, SW23a2, SW23b1, and SW23b2 are turned off, but the electric charge charged in the reference capacitors C23 and C24 at the timing T4 is held.

At a timing T6, the switches SW24a and SW24b are turned on. The power supply side terminal of the capacitor to be detected C21 and the power supply side terminal of the reference capacitor C24 are connected to each other through the switch SW24a. As a result, held charge of the capacitor to be detected C21 and the reference capacitor C24 is equalized to become a voltage Vo(−). In addition, the power supply side terminal of the reference capacitor C22 and the power supply side terminal of the reference capacitor C23 are connected to each other through the switch SW24b. As a result, held charge of the reference capacitors C22 and C23 is equalized to become a voltage Vo(+). At this point in time, the voltages Vo(+) and Vo(−) are input to the differential amplifier AMP1, and a difference between the detection voltages is output. In this case, the detection voltage difference ΔVo is expressed by the same characteristic expression as the above-described expression.

A stage from the timing T4 to the timing T6 (before the switch SW21 operates in the following period) is a second section.

As described above, in the present embodiment, the capacitor to be detected C21 and the reference capacitor C22 are charged to the first fixed voltage (voltage Vdd) while the reference capacitors C23 and C24 are charged to the second fixed voltage (ground) so that the capacitors are disconnected from each other. Then, one ends of the capacitor to be detected C21 and the reference capacitor C23 are connected to each other and one ends of the reference capacitors C22 and C24 are connected to each other. As a result, the first detection voltage difference is obtained. Then, the capacitor to be detected C21 and the reference capacitor C22 are charged to the second fixed voltage (ground) and the reference capacitors C23 and C24 are charged to the first fixed voltage (Vdd) so that the capacitors are disconnected from each other. Then, one ends of the capacitor to be detected C21 and the reference capacitor C24 are connected to each other and one ends of the reference capacitors C22 and C23 are connected to each other. As a result, the second detection voltage difference can be obtained. If a differential operation on the outputs obtained from the timing T1 to the timing T6 is performed by the differential amplifier AMP1, a repetition signal of a common mode voltage of the differential amplifier AMP1 and a difference voltage corresponding to the capacitance difference of the capacitor to be detected C21 is obtained.

According to the present embodiment, two stages are necessary. That is, the first stage, in which the capacitor to be detected C21 and the reference capacitor C22 are charged to the first fixed voltage (Vdd) and the reference capacitors C23 and C24 are charged to the second fixed voltage (ground) so that held charge of the capacitor to be detected C21 is distributed to the reference capacitor C23 (for equalization), and the second stage, in which the capacitor to be detected C21 and the reference capacitor C22 are charged to the second fixed voltage (ground) and the reference capacitors C23 and C24 are charged to the first fixed voltage (Vdd) so that held charge of the capacitor to be detected C21 is distributed to the reference capacitor C24 at the side of opposite polarity (for equalization). However, since a detection voltage difference can be output in each of the first and second stages, it is possible to prevent a reduction in the detection sensitivity caused by an increase in the number of times of signal acquisition. In addition, the held charge distributed from the capacitor to be detected C21 to the reference capacitor C23 in the first stage and the held charge distributed from the capacitor to be detected C21 to the reference capacitor C24 in the second stage have opposite polarities. Accordingly, even if noise is mixed into the capacitor to be detected C21, it is possible to remove the noise component by subsequent processing (differential and integration processing). As a result, an anti-noise property can be improved.

Next, a capacitance detector according to a second embodiment of the invention will be described.

Although the cross connection is made for inversion of an input signal polarity in a circuit section where equalization of electric charge is performed in the first embodiment, a configuration in which the input signal polarity is inverted in a subsequent process after equalization of electric charge is adopted in the second embodiment.

Figure 3:
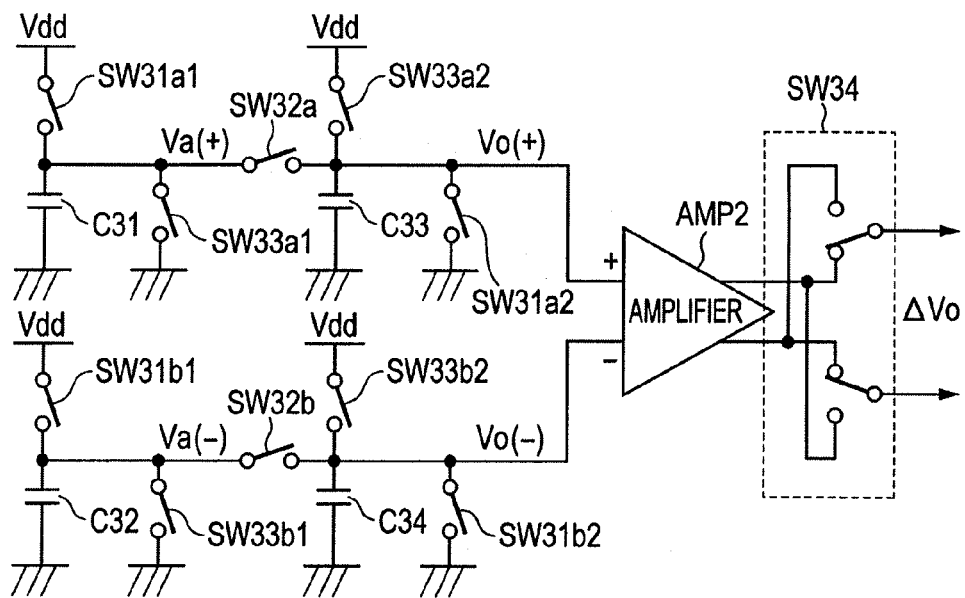
FIG. 3 is a view showing the configuration of a capacitance detector according to a second embodiment.

FIG. 3 is a view showing the configuration of a capacitance detector according to the second embodiment.

As shown in FIG. 3, the switches SW24a and 24b for cross connection are removed from the circuit section where equalization of electric charge is performed, and a switch SW34 which inverts an input signal polarity is provided at the output end of a fully differential amplifier AMP2. However, the insertion position of the switch SW34 is not limited to the output end of the fully differential amplifier AMP2, and the switch SW34 may be inserted before the fully differential amplifier AMP2 as long as it can invert the input signal polarity in the process after equalization of electric charge.

The capacitance detector according to the present embodiment includes, as main constituent components, four capacitors involving one capacitor to be detected C31 and three reference capacitors C32, C33, and C34, first switches SW31a1, SW31a2, SW31b1, SW31b2, SW33a1, SW33a2, SW33b1, and SW33b2 which charge/discharge the capacitors, second switches SW32a and SW32b which connect predetermined capacitors to each other for equalization of held charge, the fully differential amplifier AMP2, and the switch SW34 which is connected to the output end of the fully differential amplifier AMP2 and exchanges first and second outputs with each other to invert the input signal polarity. Moreover, in the present embodiment, the configuration before the fully differential amplifier AMP2 is the same as that obtained by removing the cross connection configuration from the circuit configuration of the first embodiment. Accordingly, explanation regarding the connection configuration will be omitted.

Figure 4:
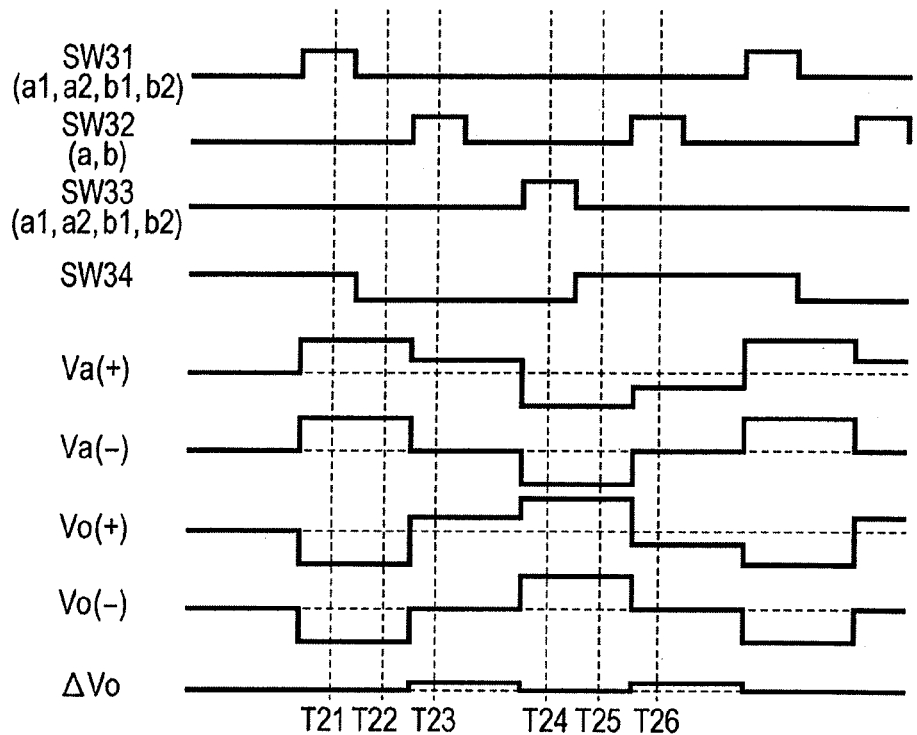
FIG. 4 shows a timing chart of opening and closing timing of each switch and an output waveform of each section in the second embodiment.

FIG. 4 shows a timing chart of opening and closing timing of each switch and an output waveform of each section in the capacitance detector according to the present embodiment. An operation of the capacitance detector according to the present embodiment will be described with reference to FIG. 4.

At a timing T21, the switches SW31a1, SW31a2, SW31b1, and SW31b2 which connect the capacitor to be detected C31 and the reference capacitor C32 to the first fixed voltage are turned on. Other switches are turned off. As a result, the capacitor to be detected C31 and the reference capacitor C32 are charged to the first fixed voltage (Vdd), and the reference capacitors C33 and C34 are charged to the second fixed voltage (ground).

At a timing T22, the switches SW31a1, SW31a2, SW31b1, and SW31b2 are turned off, but the electric charge charged at the timing T21 is held in the capacitor to be detected C31 and the reference capacitor C32. In synchronization with turning-off of the switches SW31a1, SW31a2, SW31b1, and SW31b2, the switch SW34 is set to have a connection state (state shown in FIG. 3) in which the input signal polarity is not inverted.

At a timing T23, the switches SW32a and SW32b are turned on. Terminals of the capacitor to be detected C31 and the reference capacitor C33 are connected to each other through the switch SW32a. As a result, held charge of the capacitor to be detected C31 and the reference capacitor C33 is equalized to become a voltage Vo(+). Similarly, terminals of the reference capacitors C32 and C34 are connected to each other through the switch SW32b. As a result, held charge of the reference capacitors C32 and C34 is equalized to become a voltage Vo(−). At this point in time, the voltages Vo(+) and Vo(−) are input to the fully differential amplifier AMP2, and a difference between the detection voltages is output. In this case, a detection voltage difference ΔVo (potential difference between the first and second outputs) becomes a value calculated by the same calculation expression as in the first embodiment. The first and second outputs of the fully differential amplifier AMP2 are transmitted for subsequent processing without inverting the polarities. In addition, a differential output of the fully differential amplifier AMP2 is captured for subsequent processing without inverting the input signal polarity.

At a timing T24, the switches SW33a1, SW33a2, SW33b1, and SW33b2 are turned on. The capacitor to be detected C31 is connected to the second fixed voltage (ground) through the switch SW33a1, and the reference capacitor C32 is connected to the second fixed voltage (ground) through the switch SW33b1. As a result, the capacitor to be detected C31 and the reference capacitor C32 are charged to the second fixed voltage (ground). In addition, the reference capacitor C33 is connected to the first fixed voltage (voltage Vdd) through the switch SW33a2, and a power supply side terminal of the reference capacitor C34 is connected to the first fixed voltage (voltage Vdd) through the switch SW33b2. As a result, the reference capacitors C33 and C34 are charged to the first fixed voltage (voltage Vdd).

At a timing T25, the switch SW34 is switched to a connection state, in which the input signal polarity is inverted, in synchronization with the turning-off of the switches SW33a1, SW33a2, SW33b1, and SW33b2.

At a timing T26, the switches SW32a and SW32b are turned on. As a result, held charge of the capacitor to be detected C31 and the reference capacitor C33 is equalized to become a voltage Vo(+), and held charge of the reference capacitor C32 and the reference capacitor C34 is equalized to become a voltage Vo(−). At this point in time, the voltages Vo(+) and Vo(−) are input to the fully differential amplifier AMP2, and a difference between the detection voltages is output.

In this case, since the switch SW34 is set to have a connection state in which the input signal polarity is not inverted at the timing T25, signal acquisition polarities of the first and second outputs of the fully differential amplifier AMP2 are inverted and then the outputs are output to the subsequent stage. Therefore, the input signal polarity of the detection voltage difference ΔVo (straight) obtained at the timing T23 and the input signal polarity of the detection voltage difference ΔVo (cross) obtained at a timing T26 are inverted. Then, if a differential or integration operation is performed on the voltages, they are offset because they are acquired in a state where noise directions are opposite. Accordingly, noise is reduced.

Thus, a noise removal effect equivalent to the cross connection at the timing T6 in the first embodiment can be acquired by inverting the input signal polarity of the switch SW34 in the first and second stages. As a result, the detection accuracy can be improved.

Next, a capacitance detector according to a third embodiment of the invention will be described.

In the present embodiment, since the sensitivity is reduced if a capacitor to be detected, which serves as a sensor capacitor, becomes large, a current source which extracts a predetermined amount of electric charge from the capacitor to be detected (and a reference capacitor which forms a pair together with the capacitor to be detected) is provided in order to compensate for the sensitivity reduction.

Figure 5:
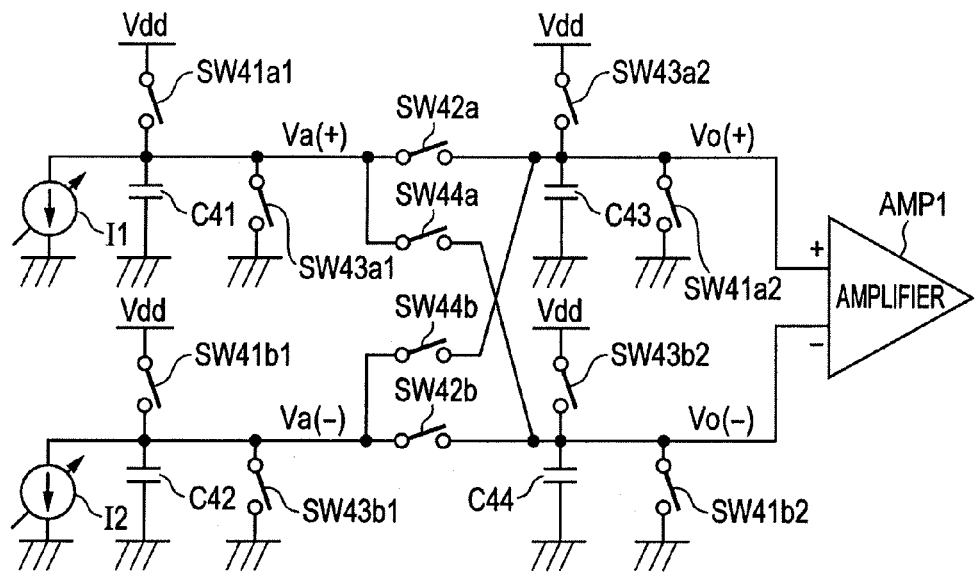
FIG. 5 is a view showing the configuration of a capacitance detector according to a third embodiment.

FIG. 5 is a view showing the configuration of a capacitance detector according to a third embodiment.

The capacitance detector according to the present embodiment includes, as main constituent components, four capacitors involving one capacitor to be detected C41 and three reference capacitors C42, C43, and C44, first switches SW41a1, SW41a2, SW41b1, SW41b2, SW43a1, SW43a2, SW43b1, and SW43b2 which charge/discharge the capacitors, second switches SW42a, SW42b, SW44a, and SW44b which connect predetermined capacitors to each other for equalization of held charge, a differential amplifier AMP1 which outputs a difference between two equalized charges (detection voltages), and variable current sources I1 and I2 which extract a predetermined amount of electric charge from the capacitor to be detected C41 and the reference capacitor C42. In addition, since the circuit configuration in the present embodiment is the same as that in the first embodiment except that the variable current sources I1 and I2 are added, an explanation regarding the connection configuration will be omitted.

Figure 6:
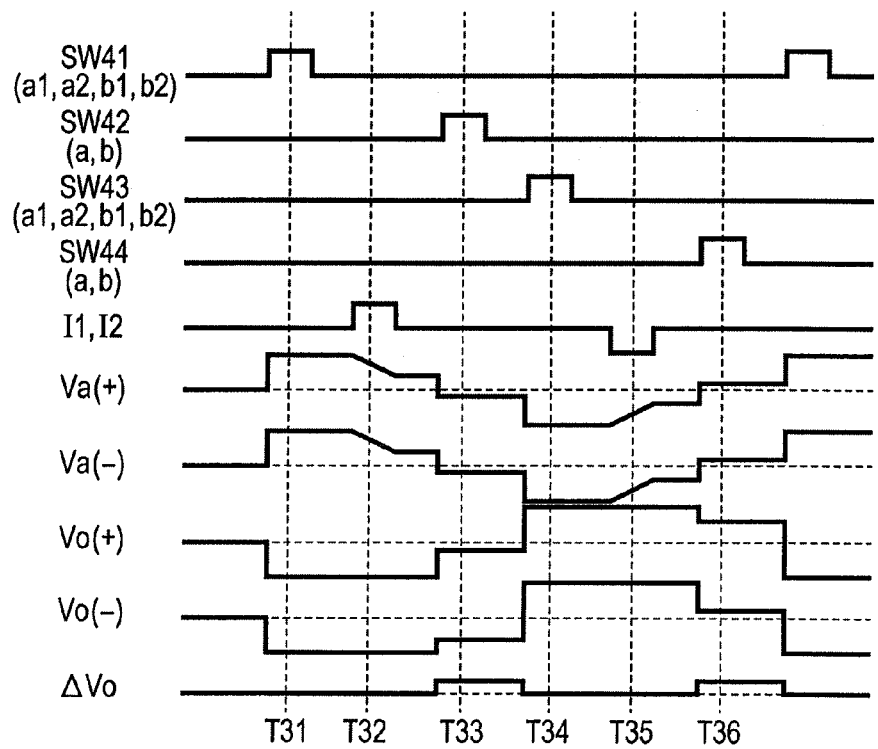
FIG. 6 shows a timing chart of opening and closing timing of each switch and an output waveform of each section in the third embodiment.
Figure 7:
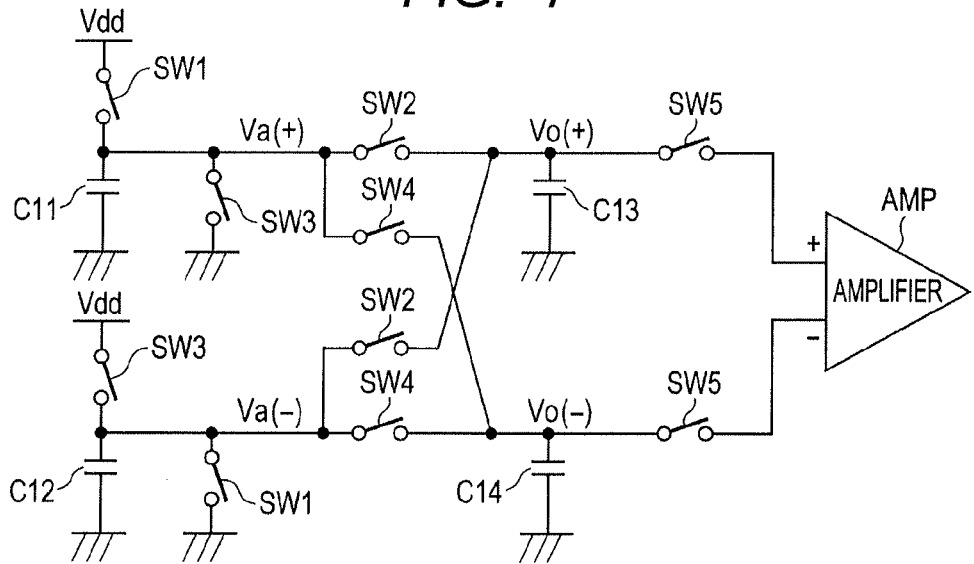
FIG. 7 is a view showing the configuration of a capacitance detection circuit disclosed in Japanese Unexamined Patent Application Publication No. 2006-253764.
Figure 8:
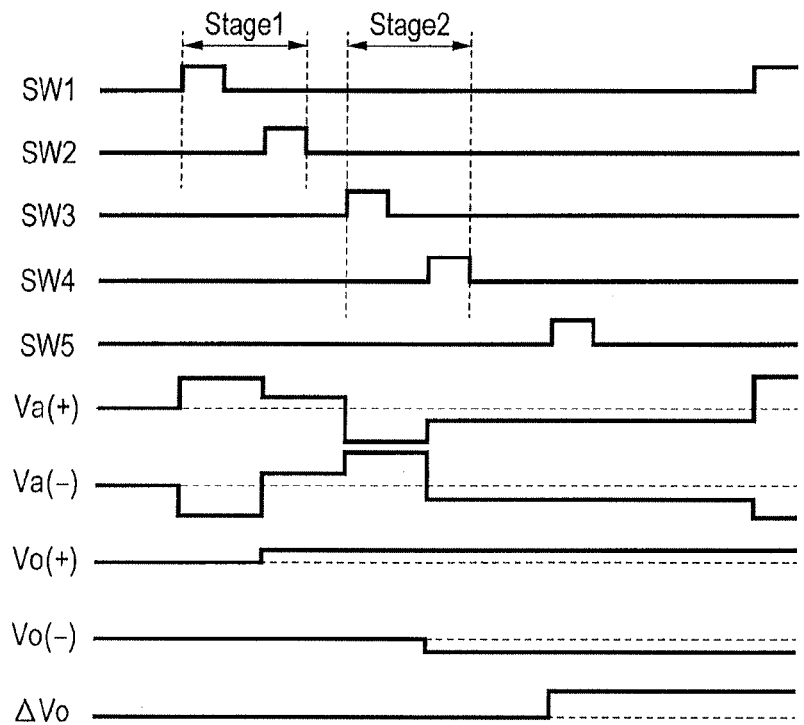
FIG. 8 is a timing chart of the capacitance detection circuit shown in FIG. 7.

FIG. 6 shows a timing chart of opening and closing timing of each switch and an output waveform of each section in an electrostatic capacitance detector according to the present embodiment. An operation of the capacitance detector according to the present embodiment will be described with reference to FIG. 6.

At a timing T31, the switches SW41a1 and SW41b1 are turned on and the other switches are turned off. As a result, the capacitor to be detected C41 and the reference capacitor C42 are charged to the first fixed voltage (Vdd), and the reference capacitors C43 and C44 are charged to the second fixed voltage (ground). After the charging, the switches SW41a1 and SW41b1 are turned off.

At a timing T32, the variable current sources I1 and I2 are made to operate only for a predetermined time in a direction of extracting positive charge from the capacitor to be detected C41 and the reference capacitor C42, such that a predetermined amount of electric charge is extracted from the capacitor to be detected C41 and the reference capacitor C42.

At a timing T33, the switches SW42a and SW42b are turned on. As a result, held charge of the capacitor to be detected C41 and the reference capacitor C43 is equalized to become a voltage Vo(+), and the held charge of the reference capacitor C42 and the reference capacitor C44 is equalized to become a voltage Vo(−). At this point in time, the voltages Vo(+) and Vo(−) are input to the differential amplifier AMP1, and a difference between the detection voltages is output.

At a timing T34, the switches SW43a1, SW43a2, SW43b1, and SW43b2 are turned on. As a result, the capacitor to be detected C41 and the reference capacitor C42 are charged to the second fixed voltage (ground), and the reference capacitors C43 and C44 are charged to the first fixed voltage (Vdd).

At a timing T35, the variable current sources I1 and I2 are made to operate only for a predetermined time in a direction of extracting negative charge from the capacitor to be detected C41 and the reference capacitor C42, such that a predetermined amount of electric charge (negative charges) is extracted from the capacitor to be detected C41 and the reference capacitor C42.

At a timing T36, the switches SW44a and SW44b are turned on. Held charge of the capacitor to be detected C41 and the reference capacitor C44 is equalized through the switching SW44a to become a voltage Vo(−), and held charge of the reference capacitors C42 and C43 is equalized through the switching SW44b to become a voltage Vo(+). At this point in time, the voltages Vo(+) and Vo(−) are input to the differential amplifier AMP1, and difference between the detection voltages is output.

The detection voltage difference ΔVo obtained at the timing T33 and T36 is expressed by the expression given below assuming that the capacitor C41 is Cs, the capacitor C42 is Cb, the capacitors C43 and C44 are Cm, the current sources I1 and I2 are Iref, and the ON time of the current source is T.

$$\Delta Vo = \frac{Cs - Cb}{Cs + Cb + Cm + \frac{Cs \cdot Cb}{Cm}} \cdot Vdd \cdot \left(1 + \frac{Iref \cdot T}{Vdd \cdot Cm}\right) \quad \text{[Expression 2]}$$

This calculation expression indicates that the detection sensitivity in the first embodiment can be increased (1+Iref·T/(Vdd·Cm)) times.

Thus, according to the present embodiment, after charging the capacitor to be detected C41 and the reference capacitor C42, a predetermined amount of electric charge is extracted from the capacitor to be detected C41 and the reference capacitor C42 by the variable current sources I1 and I2 in order to reduce the held charge. Then, by capacitance distribution using charge equalization, a detection voltage difference is obtained from the differential amplifier AMP1. Therefore, since a large capacitance difference can be ensured by extraction of a predetermined amount of electric charge using the variable current sources I1 and I2, the sensitivity can be improved.

Although the polarity of an acquired signal is inverted by the switches SW44a and SW44b in the third embodiment, the switch SW34 may also be provided before or after the fully differential amplifier AMP2, similar to the second embodiment, in order to invert the polarity of an acquired signal.

It should be understood by those skilled in the art that various modifications, combinations, sub-combinations and alternations may occur depending on design requirements and other factors insofar as they are within the scope of the appended claims of the equivalents thereof.

What is claimed is:

1. A capacitance detector comprising:
a first capacitor which is an object to be detected and has fixed base capacitance and variable capacitance;
a second capacitor charged with base charge corresponding to the base capacitance;
third and fourth capacitors which receive capacitance distribution from the first or second capacitor;
a first switching means for charging the first and second capacitors to a first fixed voltage and charging the third and fourth capacitors to a second fixed voltage in a first section and for charging the first and second capacitors to the second fixed voltage and charging the third and fourth capacitors to the first fixed voltage in a second section;
a second switching means for separating the first and second capacitors from the third and fourth capacitors during a charge period in the first and second sections and for connecting the first and second capacitors to the third and fourth capacitors in a one-to-one manner at a capacitance distribution timing in the first and second sections; and
a differential amplifier to which first and second voltages corresponding to equalized charge, which is equalized by capacitors connected to each other by the second switching means and which is held in the third and fourth capacitors, are differentially input.

2. The capacitance detector according to claim 1, wherein the second switching means performs alternate switching between a straight connection for connecting the first and third capacitors to each other and connecting the second and fourth capacitors to each other and a cross connection for connecting the first and fourth capacitors to each other and connecting the second and third capacitors to each other.

3. The capacitance detector according to claim 1, further comprising:
a third switching means for inverting an input signal polarity for a subsequent process, the third switching means being provided at an output end of the differential amplifier,
wherein the second switching means performs straight connection between the first and second capacitors and the third and fourth capacitors, and
the third switching means alternately inverts the input signal polarity.

4. The capacitance detector according to claim 1, further comprising:
a third switching means for inverting a polarity of a signal input to the differential amplifier, the third switching means being provided between the third and fourth capacitors and an input end of the differential amplifier, wherein the second switching means performs straight connection between the first and second capacitors and the third and fourth capacitors, and the third switching means alternately inverts the input signal polarity.

5. The capacitance detector according to claim 1, further comprising:

a current source which is connected to one end of each of the first and second capacitors and which extracts a predetermined amount of electric charge from the first or second capacitor after the charge period in the first and second sections.

* * * * *